US011158222B2

(12) United States Patent
Chen

(10) Patent No.: US 11,158,222 B2
(45) Date of Patent: Oct. 26, 2021

(54) TEST CIRCUIT AND TEST METHOD FOR DISPLAY PANELS

(71) Applicants: HKC Corporation Limited, Guangdong (CN); Chongqing HKC Optoelectronics Technology Co., Ltd., Chongqing (CN)

(72) Inventor: Yu-jen Chen, Chongqing (CN)

(73) Assignees: HKC CORPORATION LIMITED, Guangdong (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 185 days.

(21) Appl. No.: 16/623,200

(22) PCT Filed: Sep. 1, 2017

(86) PCT No.: PCT/CN2017/100254
§ 371 (c)(1),
(2) Date: Dec. 16, 2019

(87) PCT Pub. No.: WO2018/233068
PCT Pub. Date: Dec. 27, 2018

(65) Prior Publication Data
US 2020/0342795 A1 Oct. 29, 2020

(30) Foreign Application Priority Data
Jun. 20, 2017 (CN) .......................... 201710470336.8

(51) Int. Cl.
*G09G 3/00* (2006.01)
*G01R 31/26* (2020.01)
*G09G 3/36* (2006.01)

(52) U.S. Cl.
CPC ........ *G09G 3/006* (2013.01); *G01R 31/2607* (2013.01); *G09G 3/3648* (2013.01); *G09G 2330/12* (2013.01)

(58) Field of Classification Search
CPC .. G09G 3/006; G09G 3/3648; G09G 2330/12; G09G 2330/06; G01R 31/2607; G02F 1/133707; G02F 1/133711
(Continued)

(56) References Cited

U.S. PATENT DOCUMENTS

2008/0137021 A1  6/2008 Choi et al.
2020/0394968 A1* 12/2020 Kwon .................. G09G 3/3291
(Continued)

FOREIGN PATENT DOCUMENTS

CN    101303462 A    11/2008
CN    101847357 A     9/2010
(Continued)

*Primary Examiner* — Giovanni Astacio-Oquendo
(74) *Attorney, Agent, or Firm* — Muncy, Geissler, Olds & Lowe, P.C.

(57) ABSTRACT

A test circuit and a test method for display panels, the test circuit comprising: switch units, first test leads, first test pads, a second test pad and a second test lead; wherein numbers of the switch units, the first test leads and the first test pads are the same; each of the first test leads is configured to be electrically connected to a corresponding one of the display panels; each of the first test pads is electrically connected to an output terminal of the corresponding switch unit, and each of the first test pads is electrically connected to the corresponding first test lead; the second test pad and the second test lead are electrically connected to an input terminals of the switch units.

20 Claims, 4 Drawing Sheets

(58) Field of Classification Search
USPC .................................. 324/760.01, 537, 500
See application file for complete search history.

(56) References Cited

U.S. PATENT DOCUMENTS

| | | | |
|---|---|---|---|
| 2021/0199727 A1* | 7/2021 | Xu | G01R 31/56 |
| 2021/0209979 A1* | 7/2021 | Gao | G09G 3/2092 |

FOREIGN PATENT DOCUMENTS

| | | |
|---|---|---|
| CN | 102789076 A | 11/2012 |
| CN | 106338863 A | 1/2017 |
| CN | 107065313 A | 8/2017 |

* cited by examiner

TEST CIRCUIT AND TEST METHOD FOR DISPLAY PANELS

BACKGROUND OF THE INVENTION

Field of Invention

This disclosure relates to the display technology, such as a test circuit and a test method for display panels.

Related Art

In the process of manufacturing a display panel, it is necessary to orient liquid crystal molecules in the display panel. The process of orienting the liquid crystal molecules may adopt the following steps of: applying a voltage signal or a current signal between an array substrate and a color filter substrate, wherein at least one of the array substrate and the color filter substrate has an alignment film, which forms a polymer bulge under the action of the above-mentioned voltage or current. The polymer bulge forms a pretilt angle, which can make the liquid crystal molecules disposed between the array substrate and the color filter substrate be arranged according to a specific direction to enhance the display quality of the display panel. When the liquid crystal molecules are oriented, each display panel needs an independent lead and a bonding pad connected to the lead, so that traces are complicated. A solution in the associated technology is to connect one lead to multiple display panels.

However, adopting one lead connected to multiple display panels encounters the following problems: when the array testing is performed on the display panel, the problem of the test signal interference occurs because one lead is connected between the display panels.

SUMMARY OF THE INVENTION

This disclosure provides a test circuit and a test method for display panels to test each of the display panels while the array testing is being performed, and to test the display panels when the liquid crystal molecules are oriented.

A test circuit for display panels comprises switch units, first test leads, first test pads, a second test pad and a second test lead. Numbers of the switch units, the first test leads and the first test pads are the same; each of the first test leads is configured to be electrically connected to a corresponding one of the display panels. Each of the first test pads is electrically connected to an output terminal of the corresponding switch unit, and each of the first test pads is electrically connected to the corresponding first test lead. The second test pad and the second test lead are electrically connected to an input terminals of the switch units.

A test method for display panels comprises a step of: connecting the display panels to a test circuit. The test circuit comprises switch units, first test leads, first test pads, a second test pad and a second test lead. Numbers of the switch units, the first test leads and the first test pads are the same. Each of the first test leads is configured to be electrically connected to a corresponding display panel. Each of the first test pads is electrically connected to an output terminal of the corresponding switch unit, and each of the first test pads is electrically connected to the corresponding first test lead. The second test pad and the second test lead are electrically connected to an input terminals of the switch units.

The test method further comprises the following steps: controlling the switch units to turn off, and applying a first test signal to the display panel corresponding to the first test pad through the first test pads, controlling the switch units to turn on, and applying a second test signal to the display panels through the second test pad.

A test circuit for display panels comprises switch units, first test leads, first test pads, a second test pad and a second test lead. Numbers of the switch units, the first test leads and the first test pads are the same. Each of the first test leads is configured to be electrically connected to a corresponding one of the display panels. Each of the first test pads is electrically connected to an output terminal of the corresponding switch unit, and each of the first test pads is electrically connected to the corresponding first test lead. The second test pad and the second test lead are electrically connected to input terminals of the switch units. The test circuit further comprises third test pads. Each of the display panels corresponds to one of the third test pads, and each of the third test pads is electrically connected to the input terminal of the corresponding switch unit. The first test pad and the third test pad corresponding to the same display panel neighbor upon each other. The switch unit is a diode. An input terminal of the diode is the input terminal of the switch unit, and an output terminal of the diode is the output terminal of the switch unit. The first test pads are arranged in an array in an extending direction of the second test lead.

DETAILED DESCRIPTION OF THE INVENTION

This disclosure will be described in detail according to the preferred embodiment with reference to the drawings.

Figure 1:
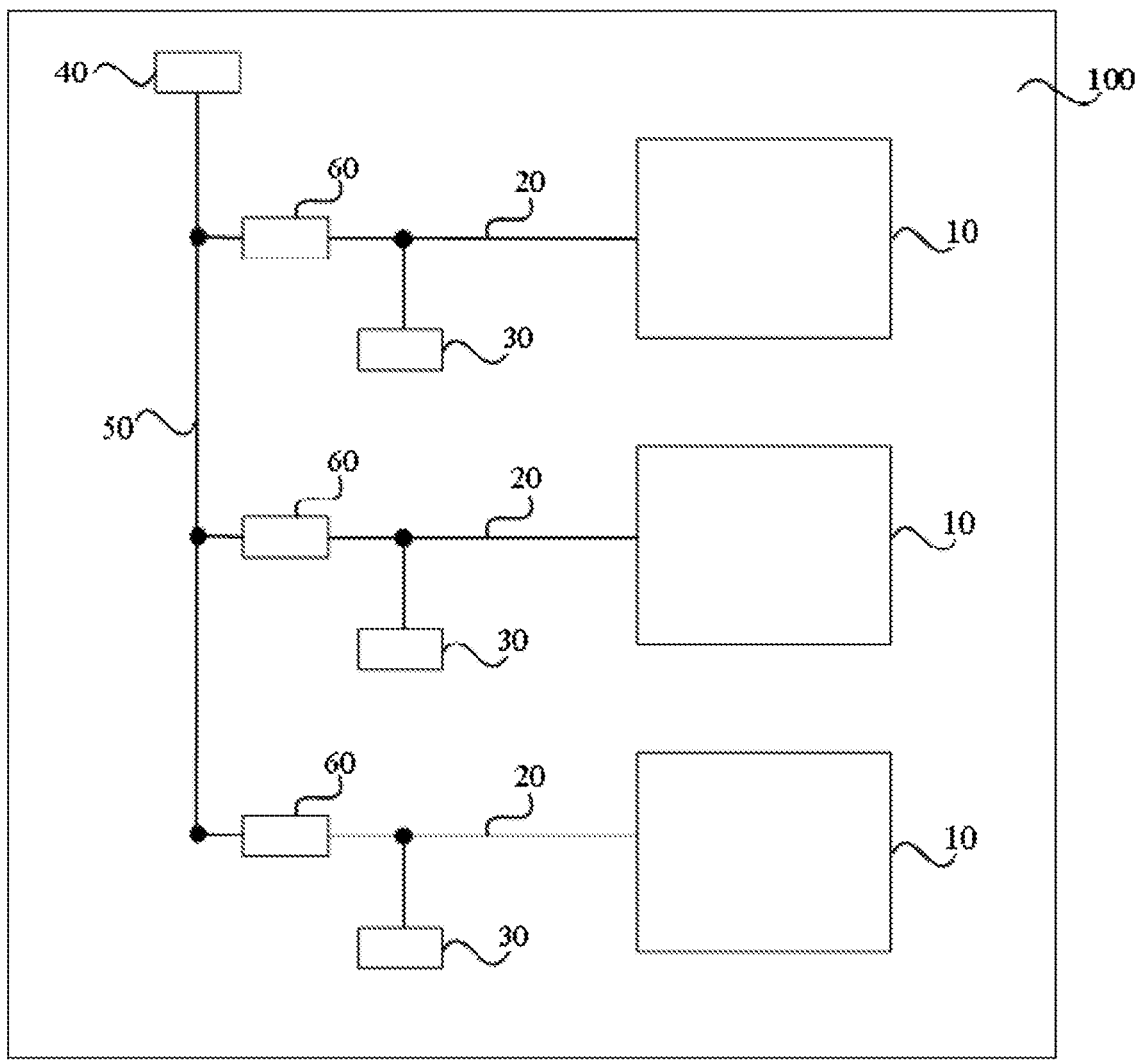
FIG. 1 shows a test circuit for display panels provided by this embodiment.

FIG. 1 shows a test circuit for display panels provided by this embodiment. Referring to FIG. 1, the test circuit for the display panels provided by this embodiment includes switch units 60, first test leads 20, first test pads 30, a second test pad 40 and a second test lead 50. Multiple display panels 10 are formed on a mother substrate 100. Each of the display panels 10 corresponds to a switch unit 60, a first test lead 20 and a first test pad 30. Each of the first test leads 20 is electrically connected to the corresponding display panel 10. Each of the first test pads 30 is electrically connected to an output terminal of the corresponding switch unit 60 and the corresponding first test lead 20, and the second test pad 40 and the second test lead 50 are electrically connected to input terminals of the switch units 60.

Optionally, the first test pads 30 are arranged in an array in an extending direction of the second test lead 50. The first test pads are arranged in an array to facilitate the use of a probe for applying a test signal to the first test pads.

In FIG. 1, only the second test pad and the second test lead electrically connected to the input terminals of the three switch units are exemplarily disposed. In this embodiment, the number of the switch units electrically connected to the second test pad and the second test lead is not limited.

This embodiment provides a test circuit for display panels. When the array testing is performed on the display panels, the switch unit 60 is turned off to prevent the problem of the test signal interference from occurring due to one lead connected between the multiple display panels 10, to test each of the display panels 10 independently while the array testing is being performed, and to improve the accuracy of array testing. When the liquid crystal molecules are oriented in the display panels 10, the switch unit 60 is turned on to form pretilt angles in multiple display panels 10 when the liquid crystal molecules are oriented, and to improve the efficiency of orienting the liquid crystal molecules in the display panels.

In addition, compared with in the case where each of the display panels 10 in the related technology needs to be provided with a second test lead 50 and a second test pad 40, disposing only a second test pad 40 and a second test lead 50 in this embodiment can simplify the traces and save the costs. The liquid crystal molecules in the display panels are oriented by, for example, adding chemical monomers to the liquid crystal. In the process of the alignment, the chemical monomers are subjected to the irradiation of the ultra-violet rays and are polymerized to form polymer bulges for fixing the liquid crystal to form a pretilt angle. The orientation process of the liquid crystal moleculars may be performed by applying an alignment voltage sequence to the display panel, wherein the liquid crystal is overturned in an ordered manner under the action of the electric field, and then the voltage is keep unchanged. Meanwhile, the ultra-violet rays are used to irradiate the display panel, and the chemical monomers in the display panels are polymerized under the condition of the irradiation of the ultra-violet rays to form polymer bulges arranged in an ordered manner, so that the display panel forms a pretilt angle, and the liquid crystal molecules are arranged in an ordered manner under the action of the pretilt angle of the display panel.

Figure 2:
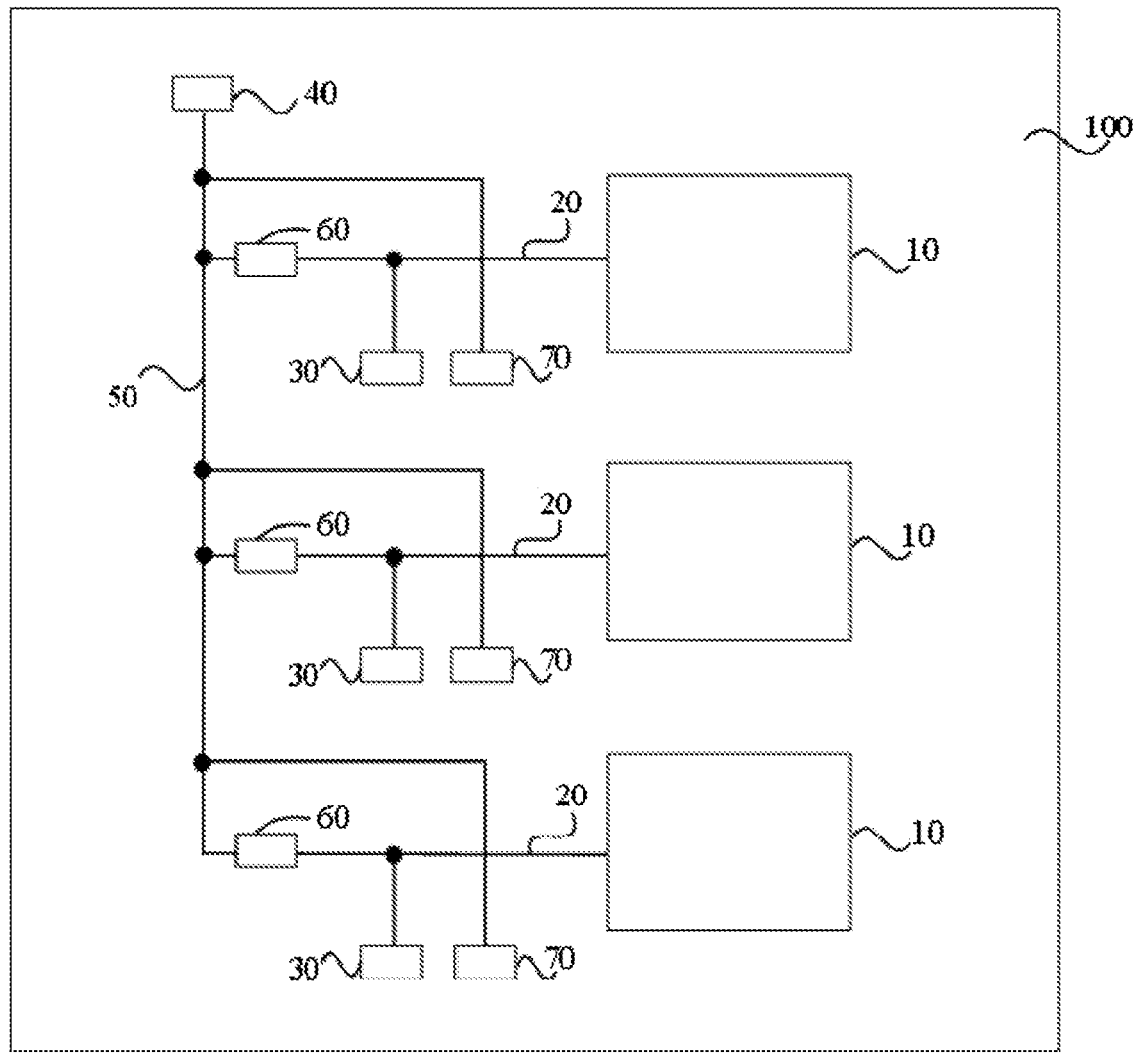
FIG. 2 shows another test circuit for display panels provided by this embodiment.

FIG. 2 shows another test circuit for display panels provided by this embodiment. As shown in FIG. 2, on the basis of the above-mentioned embodiment, the test circuit also includes third test pads 70, each of the display panels 10 corresponds to a third test pad 70, each of the third test pads 70 is electrically connected to an input terminal of the corresponding switch unit 60, and the first test pad 30 and the third test pad 70 corresponding to the same display panel neighbor upon each other. When the array testing is performed on the display panels 10, it is necessary to apply a test signal to the first test pad 30, and it is necessary to ensure that there is no mutual signal interference between the display panels 10, that is, the switch unit 60 needs to be in the closed state. Thus, the first test pad 30 and the third test pad 70 neighbor upon each other in order to facilitate the use of the probe to simultaneously load the signal sent from the signal source on the first test pad 30 and the third test pad 70, to control the switch unit 60 to turn off through the third test pad 70, and to send the test signal to the display panel 10 through the first test pad 30 at the same time.

Figure 3:
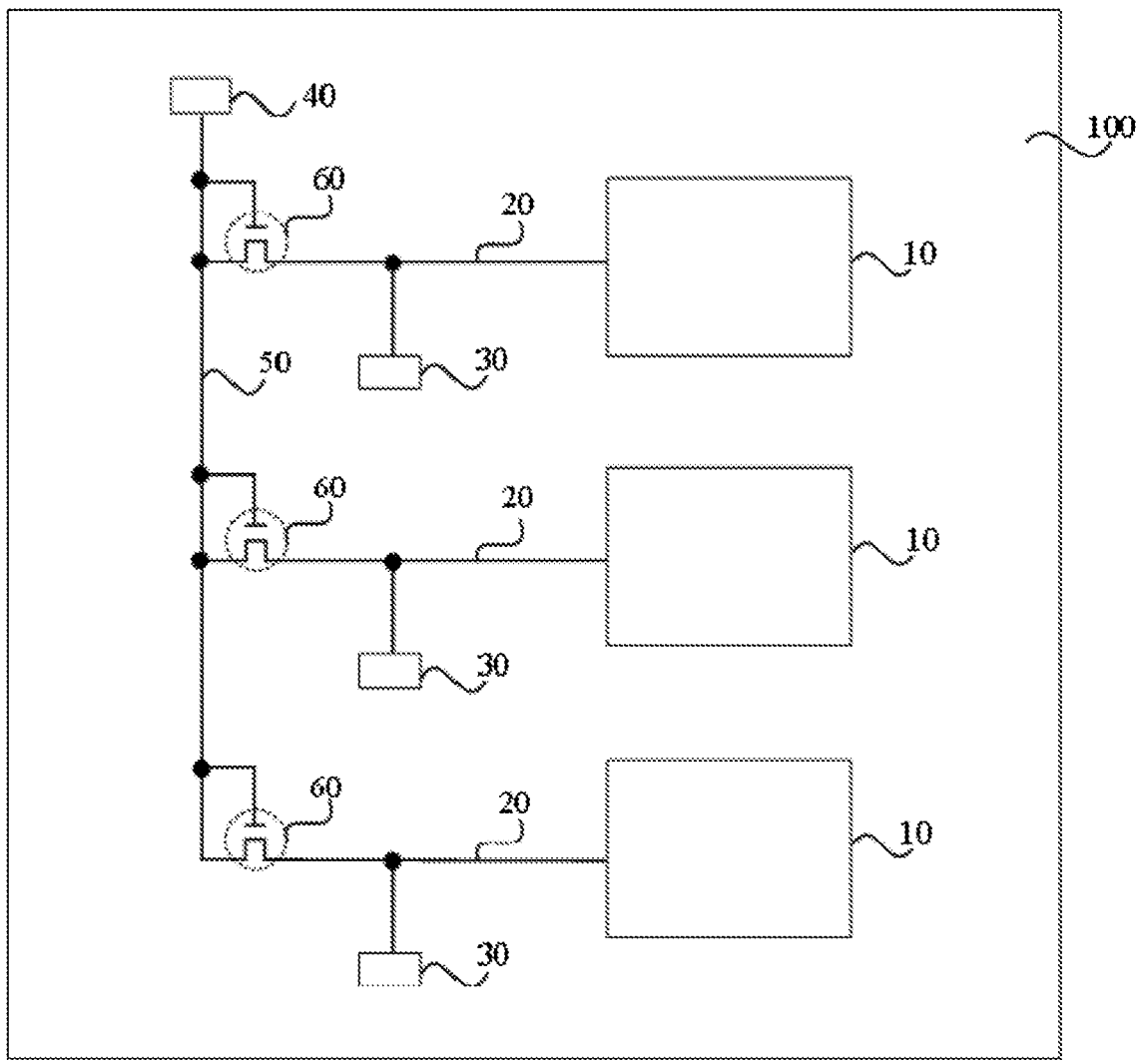
FIG. 3 shows another test circuit for display panels provided by this embodiment.

FIG. 3 shows another test circuit for display panels provided by this embodiment. As shown in FIG. 3, on the basis of the above-mentioned embodiment, the switch unit 60 is a transistor, an input terminal and a control terminal of the transistor are short circuited as the input terminal of the switch unit 60, and an output terminal of the transistor is the output terminal of the switch unit 60. The transistor can be an electronic transistor, a field effect transistor or a thin film transistor. An input terminal of the field effect transistor or the thin film transistor can be a source or a drain, an output terminal of the field effect transistor or the thin film tran-sistor can be the drain or the source, and a control terminal of the field effect transistor or the thin film transistor can be a gate. In this embodiment, the test circuit may further comprises third test pads. Each of the display panels corresponds to one of the third test pads, each of the third test pads is electrically connected to the input terminal of the corresponding switch unit (such as the transistor of this embodiment), and the first test pad and the third test pad corresponding to the same display panel neighbor upon each other.

Figure 4:
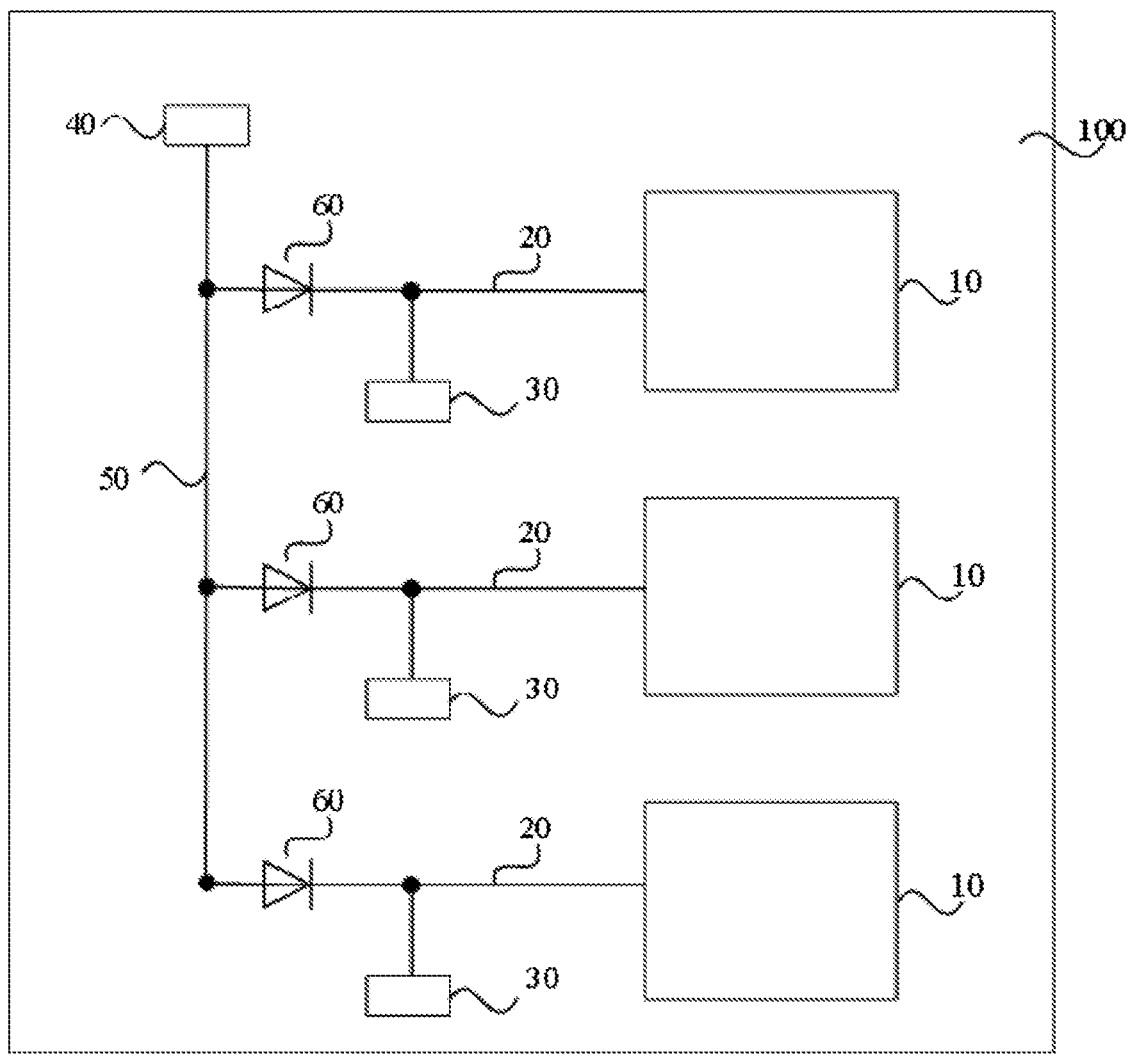
FIG. 4 shows another test circuit for display panels provided by this embodiment.

FIG. 4 shows another test circuit for display panels provided by this embodiment. As shown in FIG. 4, on the basis of the above-mentioned embodiment, the switch unit 60 is a diode, an input terminal of the diode is the input terminal of the switch unit 60, and an output terminal of the diode is the output terminal of the switch unit 60. In this embodiment, the test circuit may further comprises third test pads. Each of the display panels corresponds to one of the third test pads, each of the third test pads is electrically connected to the input terminal of the corresponding switch unit (such as the diode of this embodiment), and the first test pad and the third test pad corresponding to the same display panel neighbor upon each other.

In some embodiments, the display panels can be liquid crystal display panels, quantum dot liquid crystal display panels or other display panels. The display panels can be applied to, for example, a cell phone, a tablet computer, or a television.

The mother substrate 100 shown in FIGS. 1 to 4 may be made of a glass substrate. Compared with the production of the single display panel 10 at a time, simultaneously manufacturing the multiple display panels 10 on the same mother substrate 100 can improve the production efficiency of the display panel 10. After performing the array testing on the multiple display panels 10 on the mother substrate 100 and orienting the liquid crystal molecules, the mother substrate 100 is cut so as to obtain an independent display panel 10. In the process of cutting the mother substrate 100, the above-mentioned test circuit can be cut and removed, that is, the above-mentioned test circuit may not be included in the independent display panel 10 after the cutting is completed.

This embodiment also provides a test method for display panels. Referring to FIGS. 1 to 4, the test circuit for the display panels includes switch units 60, first test leads 20, first test pads 30, a second test pad 40 and a second test lead 50. Each of the display panels 10 corresponds to a switch unit 60, a first test lead 20 and a first test pad 30. Each of the first test leads 20 is electrically connected to the corresponding display panel 10. Each of the first test pads 30 is electrically connected to an output terminal of the corresponding switch unit 60 and the corresponding first test lead 20. The second test pad 40 and the second test lead 50 are electrically connected to input terminals of the switch units 60.

The test method of the display panel provided by this embodiment includes: controlling the switch units 60 to turn off, and applying a first test signal to the display panel 10 corresponding to the first test pad 30 through the first test pads 30 when the array testing is performed on the display panel 10; and controlling the switch units 60 to turn on, and applying a second test signal to the multiple display panels 10 through the second test pad 40 when the liquid crystal molecules are oriented in the display panel 10.

In an embodiment, when the array testing is performed on the display panel 10, a control signal is inputted through the second test pad 40 to control the switch units 60 to turn off, and the first test signal is applied to the display panel 10 corresponding to the first test pad 30 through the first test pads 30. When the liquid crystal molecules are oriented in the display panel 10, a second test signal is inputted through the second test pad 40 to control the switch units 60 to turn on, and the second test signal is applied to the multiple display panels 10.

In another embodiment, the test circuit also includes third test pads 70, each of the display panels 10 corresponds to a third test pad 70, each of the third test pads 70 is electrically connected to the input terminal of the corresponding switch unit 60, and the first test pad 30 and the third test pad 70 corresponding to the same display panel neighbor upon each other. When the array testing is performed on the display panel 10, the control signal is inputted through the third test pad 70 to control the switch units 60 to turn off, and the first test signal is applied to the display panel 10 corresponding to the first test pad 30 through the first test pads 30. When the liquid crystal molecules are oriented in the display panel 10, the second test signal is inputted through the second test pad 40 to control the switch units 60 to turn on, and the second test signal is applied to the multiple display panels 10.

Optionally, the switch unit 60 is a transistor, an input terminal and a control terminal of the transistor are short circuited as the input terminal of the switch unit 60, and an output terminal of the transistor is the output terminal of the switch unit 60. The transistor can be an electronic transistor, a field effect transistor or a thin film transistor. An input terminal of the field effect transistor or the thin film transistor can be a source or a drain, an output terminal of the field effect transistor or the thin film transistor can be the drain or the source, and a control terminal of the field effect transistor or the thin film transistor can be a gate. When the array testing is performed on the display panel 10, transistors are controlled to turn off, for example, a low level signal is applied to control the transistors to turn off, and the first test signal is applied to the display panel 10 corresponding to the first test pad 30 through the first test pads 30. When the liquid crystal molecules are oriented in the display panel 10, a second test signal is inputted through the second test pad 40 to control the transistors to turn on, and the second test signal is applied to the multiple display panels 10. In other implementation methods, when the array testing is performed on the display panel 10, no control signal is applied to the gates of the transistors. At this time, the gates of the transistors are turned off, and the first test signal is applied to the display panel corresponding to the first test pad 30 through the first test pads 30. When the array testing is performed on the display panel 10, the control signal may be inputted through the second test pad 40 or the third test pad 70 to control the transistors to turn off.

Optionally, the switch unit 60 is a diode, an input terminal of the diode is the input terminal of the switch unit 60, and an output terminal of the diode is the output terminal of the switch unit 60. When the array testing is performed on the display panels 10, the diodes are controlled to turn off (for example, the PN junction reverse voltage of the diode is applied to turn off the PN junction of the diode) to present the high resistance, and the first test signal is applied to the display panels 10 corresponding to the first test pads 30 through the first test pads 30. When the liquid crystal molecules are oriented in the display panels 10, the second test signal is inputted through the second test pad 40 to control the diodes to turn on (for example, the PN junction forward voltage of the diode is applied to turn on the PN junction of the diode) to present the low resistance, and the second test signal is applied to the multiple display panels 10.

This embodiment provides a test method for display panels. Controlling the switch units 60 to turn off when the array testing is performed on the display panels 10 can prevent the problem of the test signal interference from occurring due to one lead connected between the multiple display panels 10, can test each of the display panels 10 independently while the array testing is being performed, and can improve the accuracy of array testing. Controlling the switch units 60 to turn on when the liquid crystal molecules are oriented in the display panels 10 can test multiple display panels 10 when the liquid crystal molecules are oriented, and can improve the efficiency of orienting the liquid crystal molecules in the display panels.

What is claimed is:

1. A test circuit for display panels, the test circuit comprising:
    switch units;
    first test leads;
    first test pads; and
    a second test pad and a second test lead;
    wherein numbers of the switch units, the first test leads and the first test pads are the same; each of the first test leads is configured to be electrically connected to a corresponding one of the display panels; each of the first test pads is electrically connected to an output terminal of the corresponding switch unit, and each of the first test pads is electrically connected to the corresponding first test lead; and the second test pad and the second test lead are electrically connected to input terminals of the switch units.

2. The test circuit according to claim 1, further comprising:
    third test pads each corresponding to one of the display panels, and being electrically connected to the input terminal of the corresponding switch unit;
    wherein the first test pad and the third test pad corresponding to the same display panel neighbor upon each other.

3. The test circuit according to claim 1, wherein the switch unit is a transistor; an input terminal and a control terminal of the transistor are short circuited as the input terminal of the switch unit; and an output terminal of the transistor is the output terminal of the switch unit.

4. The test circuit according to claim 3, wherein the transistor comprises an electronic transistor, a field effect transistor or a thin film transistor.

5. The test circuit according to claim 4, wherein an input terminal of the field effect transistor is a source or a drain, an output terminal of the field effect transistor is the drain or the source, a control terminal of the field effect transistor is a gate, an input terminal of the thin film transistor is a source or a drain, an output terminal of the thin film transistor is the drain or the source, and a control terminal of the thin film transistor is a gate.

6. The test circuit according to claim 1, wherein the switch unit is a diode, an input terminal of the diode is the input terminal of the switch unit, and an output terminal of the diode is the output terminal of the switch unit.

7. The test circuit according to claim 1, wherein the first test pads are arranged in an array in an extending direction of the second test lead.

8. The test circuit according to claim 1, wherein the display panels comprise liquid crystal display panels or quantum dot liquid crystal display panels.

9. A test method for display panels, the test method comprising: connecting the display panels to a test circuit, wherein the test circuit comprises:
- switch units;
- first test leads;
- first test pads; and
- a second test pad and a second test lead;
- wherein numbers of the switch units, the first test leads and the first test pads are the same; each of the first test leads is configured to be electrically connected to a corresponding display panel; each of the first test pads is electrically connected to an output terminal of the corresponding switch unit, and each of the first test pads is electrically connected to the corresponding first test lead; and the second test pad and the second test lead are electrically connected to input terminals of the switch units; and the test method further comprises:
- controlling the switch units to turn off, and applying a first test signal to the display panel corresponding to the first test pad through the first test pads; and
- controlling the switch units to turn on, and applying a second test signal to the display panels through the second test pad.

10. The test method according to claim 9, wherein:
- controlling the switch units to turn off comprises: inputting a control signal through the second test pad to control the switch units to turn off; and
- controlling the switch units to turn on comprises: inputting the second test signal through the second test pad to control the switch units to turn on.

11. The test method according to claim 9, wherein the test circuit further comprises:
- third test pads each corresponding to one of the display panels, and being electrically connected to the input terminal of the corresponding switch unit;
- wherein the first test pad and the third test pad corresponding to the same display panel neighbor upon each other;
- wherein a control signal is inputted through the third test pad to control the switch units to turn off, and a first test signal is applied to the display panel corresponding to the first test pad through the first test pads.

12. The test method according to claim 9, wherein the switch unit is a transistor, an input terminal and a control terminal of the transistor are short circuited as the input terminal of the switch unit, and an output terminal of the transistor is the output terminal of the switch unit.

13. The test method according to claim 12, wherein the transistor comprises an electronic transistor, a field effect transistor or a thin film transistor.

14. The test method according to claim 13, wherein an input terminal of the field effect transistor is a source or a drain, an output terminal of the field effect transistor is the drain or the source, a control terminal of the field effect transistor is a gate, an input terminal of the thin film transistor is a source or a drain, an output terminal of the thin film transistor is the drain or the source, and a control terminal of the thin film transistor is a gate.

15. The test method according to claim 13, wherein controlling the transistors to turn off comprises: applying no control signal to the gates of the transistors to turn off the transistors.

16. The test method according to claim 12, wherein controlling the transistors to turn off comprises: applying a low level signal to control the transistors to turn off.

17. The test method according to claim 9, wherein the switch unit is a diode, an input terminal of the diode is the input terminal of the switch unit, and an output terminal of the diode is the output terminal of the switch unit.

18. The test method according to claim 17, wherein:
- controlling the diodes to turn off comprises: applying a reverse voltage to the diodes to control the diodes to turn off; and
- controlling the diodes to turn on comprises: inputting the second test signal through the second test pad to control the diodes to turn on.

19. The test method according to claim 9, wherein the first test pads are arranged in an array in an extending direction of the second test lead.

20. A test circuit for display panels, the test circuit comprising:
- switch units;
- first test leads;
- first test pads; and
- a second test pad and a second test lead;
- wherein numbers of the switch units, the first test leads and the first test pads are the same, each of the first test leads is configured to be electrically connected to a corresponding one of the display panels, each of the first test pads is electrically connected to an output terminal of the corresponding switch unit, each of the first test pads is electrically connected to the corresponding first test lead, and the second test pad and the second test lead are electrically connected to input terminals of the switch units; and
- wherein the test circuit further comprises third test pads, the display panels each corresponding to one of the third test pads, each of the third test pads is electrically connected to the input terminal of the corresponding switch unit; the first test pad and the third test pad corresponding to the same display panel neighbor upon each other; the switch unit is a diode, an input terminal of the diode is the input terminal of the switch unit, and an output terminal of the diode is the output terminal of the switch unit; and the first test pads are arranged in an array in an extending direction of the second test lead.

* * * * *